United States Patent
Magri' et al.

(10) Patent No.: US 11,728,422 B2
(45) Date of Patent: Aug. 15, 2023

(54) POWER MOSFET DEVICE HAVING IMPROVED SAFE-OPERATING AREA AND ON RESISTANCE, MANUFACTURING PROCESS THEREOF AND OPERATING METHOD THEREOF

(71) Applicant: STMicroelectronics S.r.l., Agrate Brianza (IT)

(72) Inventors: Angelo Magri', Belpasso (IT); Stefania Fortuna, Aci Bonaccorsi (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 164 days.

(21) Appl. No.: 17/096,697

(22) Filed: Nov. 12, 2020

(65) Prior Publication Data

US 2021/0151599 A1   May 20, 2021

(30) Foreign Application Priority Data

Nov. 14, 2019   (IT) .................. 102019000021171

(51) Int. Cl.
*H01L 29/78* (2006.01)
*H01L 21/265* (2006.01)
(Continued)

(52) U.S. Cl.
CPC .... *H01L 29/7813* (2013.01); *H01L 21/26513* (2013.01); *H01L 21/765* (2013.01);
(Continued)

(58) Field of Classification Search
CPC ........... H01L 29/7813; H01L 21/26513; H01L 21/765; H01L 29/0696; H01L 29/1095;
(Continued)

(56) References Cited

U.S. PATENT DOCUMENTS 4,374,455 A * 2/1983 Goodman ........... H01L 29/7802
257/E29.066
4,672,407 A * 6/1987 Nakagawa ........... H01L 29/7395
257/E29.066
(Continued)

FOREIGN PATENT DOCUMENTS

DE       102 50 175 A1   5/2004
WO       2006/059300 A2  6/2006
WO       WO 2019123601 A1 6/2019

OTHER PUBLICATIONS

Fusillo et al., "Low Voltage MOSFET's Behavior in FBSOA," *Power Electronics Europe, Issue 4*, 2016, 4 pages.
(Continued)

*Primary Examiner* — Mohammad M Hoque
(74) *Attorney, Agent, or Firm* — Seed Intellectual Property Law Group LLP

(57) ABSTRACT

A power MOSFET device includes an active area accommodating a first body region and a second body region having a first and, respectively, a second conductivity value. The second value is higher than the first value. A first channel region is disposed in the first body region between a first source region and a drain region, and the first channel region has and having a first channel length. A second channel region is disposed in the second body region between a second source region and the drain region, and the second channel region has and having a second channel length smaller than the first channel length. A first device portion, having a first threshold voltage, includes the first channel region, and a second device portion, having a second threshold voltage higher than the first threshold voltage, includes the second channel region.

18 Claims, 9 Drawing Sheets

(51) Int. Cl.
    *H01L 21/765*     (2006.01)
    *H01L 29/06*      (2006.01)
    *H01L 29/10*      (2006.01)
    *H01L 29/40*      (2006.01)
    *H01L 29/66*      (2006.01)

(52) U.S. Cl.
    CPC ...... *H01L 29/0696* (2013.01); *H01L 29/1095* (2013.01); *H01L 29/407* (2013.01); *H01L 29/66734* (2013.01)

(58) Field of Classification Search
    CPC ............. H01L 29/407; H01L 29/66734; H01L 29/1033; H01L 29/66712; H01L 29/7803
    USPC ......................................................... 257/331
    See application file for complete search history.

(56) References Cited

U.S. PATENT DOCUMENTS

| | | | | |
|---|---|---|---|---|
| 4,931,408 A * | 6/1990 | Hshieh | .............. | H01L 29/66719 438/273 |
| 5,528,058 A * | 6/1996 | Pike, Jr. | .............. | H01L 21/3065 257/144 |
| 5,753,942 A * | 5/1998 | Seok | .................... | H01L 29/7395 257/E29.198 |
| 5,817,546 A * | 10/1998 | Ferla | ................... | H01L 29/1095 257/E29.066 |
| 5,998,834 A * | 12/1999 | Williams | ............ | H01L 29/1095 257/334 |
| 6,114,726 A * | 9/2000 | Barkhordarian | .... | H01L 29/1095 257/E29.066 |
| 6,228,719 B1 * | 5/2001 | Frisina | ................ | H01L 29/0878 438/156 |
| 6,573,534 B1 | 6/2003 | Kumar et al. | | |
| 7,312,501 B2 * | 12/2007 | Ishizaka | .............. | H01L 29/0696 257/E21.409 |
| 7,598,567 B2 | 10/2009 | Hefner et al. | | |
| 9,190,492 B2 * | 11/2015 | Consentino | ......... | H01L 29/7813 |
| 10,818,495 B2 * | 10/2020 | Chan | ...................... | H01L 29/78 |
| 10,910,478 B1 * | 2/2021 | Xu | ...................... | H01L 29/7802 |
| 10,950,695 B1 * | 3/2021 | Potera | ................. | H01L 29/1033 |
| 2001/0012654 A1 * | 8/2001 | Magri' | ................ | H01L 29/0696 257/E29.066 |
| 2003/0006453 A1 * | 1/2003 | Liang | .................. | H01L 29/7802 257/E29.259 |
| 2004/0021173 A1 * | 2/2004 | Sapp | .................... | H02M 3/1588 257/330 |
| 2005/0035398 A1 * | 2/2005 | Williams | ............ | H01L 29/7827 257/E29.066 |
| 2007/0161217 A1 * | 7/2007 | Salinas | ............. | H01L 21/28247 257/E21.198 |
| 2007/0262390 A1 * | 11/2007 | Ishida | ................. | H01L 29/7397 257/E29.066 |
| 2010/0295060 A1 * | 11/2010 | Kudou | .............. | H01L 29/66068 257/77 |
| 2011/0127607 A1 * | 6/2011 | Cai | ..................... | H01L 29/7835 257/E29.261 |
| 2012/0007139 A1 * | 1/2012 | Tanaka | .............. | H01L 29/66333 257/E29.199 |
| 2012/0049902 A1 * | 3/2012 | Corona | ............... | H01L 29/7322 257/77 |
| 2012/0126880 A1 * | 5/2012 | Patti | .................... | H01L 29/0834 438/138 |
| 2012/0205739 A1 | 8/2012 | Yamashita | | |
| 2013/0248981 A1 * | 9/2013 | Okumura | ............ | H01L 29/1095 257/329 |
| 2013/0334597 A1 * | 12/2013 | Yamashita | .......... | H01L 29/7397 257/334 |
| 2014/0183553 A1 * | 7/2014 | Zhang | ............... | H01L 29/66378 257/77 |
| 2014/0332901 A1 * | 11/2014 | Yang | ................. | H01L 29/66659 257/401 |
| 2015/0380494 A1 * | 12/2015 | Furuhashi | ........... | H01L 29/1608 257/77 |
| 2017/0077221 A1 * | 3/2017 | Yilmaz | ................. | H01L 29/404 |
| 2017/0098609 A1 * | 4/2017 | Harrington, III | ... | H01L 29/1095 |
| 2017/0141206 A1 * | 5/2017 | Koga | .................. | H01L 29/7802 |
| 2017/0162679 A1 | 6/2017 | Schmidt | | |
| 2017/0271442 A1 * | 9/2017 | Uehara | .............. | H01L 29/0634 |
| 2017/0288026 A1 | 10/2017 | Hikasa | | |
| 2017/0301784 A1 * | 10/2017 | Rieger | ............... | H01L 29/4238 |
| 2017/0323970 A1 * | 11/2017 | Dolny | ................ | H01L 29/7816 |
| 2018/0083129 A1 | 3/2018 | Kitagawa | | |
| 2018/0308936 A1 * | 10/2018 | Shimizu | ............. | H01L 29/1608 |
| 2020/0381551 A1 * | 12/2020 | Nagakura | ......... | H01L 29/66727 |
| 2021/0013310 A1 * | 1/2021 | Leendertz | ......... | H01L 29/66734 |
| 2021/0399089 A1 | 12/2021 | Saggio et al. | | |
| 2022/0384578 A1 * | 12/2022 | Rahimo | ............. | H01L 29/0696 |

OTHER PUBLICATIONS

Breglio et al., "Electro-Thermal instability in low voltage Power MOS:Experimental characterization," 11th International Symposium on Power Semiconductor Devices and ICs, May 26-28, 1999, Toronto, ON, Canada, pp. 233-236.

Consoli et al., "Thermal Instability of Low Voltage Power-MOSFETs," 30th Annual IEEE Power Electronics Specialists Conference, Jul. 1, 1999, Charleston, SC, pp. 345-350.

Hamada et al. "Low On-Resistance SiC-MOSFET with a 3.3-kV Blocking Voltage" Mitsubishi Electric Technical Report Mar. 2015 pp. 14-17.

Pintilie et al. "Analysis of electron traps at the 4H—SICSIO2 interface; influence by nitrogen implantation prior to wet oxidation" *Journal of Applied Physics 108* 024503 2010 9 pages.

Soler et al. "High Voltage 4H-SiC Power MOSFETs with Boron doped gate oxide" *IEEE Transactions on Industrial Electronics 64*(11) Nov. 2017 9 pages.

* cited by examiner

POWER MOSFET DEVICE HAVING IMPROVED SAFE-OPERATING AREA AND ON RESISTANCE, MANUFACTURING PROCESS THEREOF AND OPERATING METHOD THEREOF

BACKGROUND

Technical Field

The present disclosure relates to a power MOSFET device having improved safe-operating area and ON resistance, to the manufacturing process thereof and to the operating method thereof.

Description of the Related Art

As is known, power devices are electronic devices that are adapted to work at high voltages and/or currents, for example with voltages that reach 1700 V in inhibition state, and with currents of up to several tens/hundreds of amps, and find use in multiple fields of application. For instance, they are commonly used in audio amplifiers, engine-control devices, and power supplies or power switches, and include power diodes, power transistors, thyristors, IGBTs (Insulated-Gate Bipolar Transistors), and MOSFETs (Metal-Oxide-Semiconductor Field-Effect Transistors).

In particular, in the case of power MOSFET devices, they are at times used in saturation mode (operation in active region) as sources of constant current, which is regulated by varying the value of the gate-to-source voltage $V_{GS}$. In fact, in saturation mode, the drain-to-source current $I_{DS}$ is practically independent of the drain-to-source voltage $V_{DS}$, but varies as a function of the voltage $V_{GS}$.

In different applications, the power MOSFET device operates in linear mode (also referred to as ohmic or triode region), switching from an ON state to an OFF state, and vice versa. The linear mode is characterized by a linear relation between the current $I_{DS}$ and the voltage $V_{DS}$, and therefore by a constant value of drain-to-source ON resistance $R_{DSon}$ (also referred to as hereinafter as ON resistance $R_{DSon}$). In this operating mode, the switching rate between the OFF and ON states affects the characteristics of the power MOSFET device. In fact, the slower is the transition from the ON state to the OFF state, the greater is the power dissipation during the switching, and the greater is the likelihood of a thermal drift of the threshold voltage $V_{TH}$ of the power MOSFET device, as explained hereinafter.

In particular, the thermal drift is caused by a phenomenon of positive reaction that involves the threshold voltage $V_{TH}$ and the junction temperature $T_J$ of the power MOSFET device (i.e., the maximum operating temperature of a semiconductor body in the power MOSFET device). In fact, an increase in the junction temperature $T_J$ by the Joule effect causes a reduction of the threshold voltage $V_{TH}$, the flowing of a higher current, and a further increase in the junction temperature $T_J$.

In order to reduce power dissipation, power MOSFET devices are currently designed so as to present a low ON resistance $R_{DSon}$, enabling considerable gains in efficiency at high switching frequencies. The reduction of the ON resistance $R_{DSon}$ makes, however, the power MOSFET device less stable from a thermal standpoint when it operates in saturation mode, on account of the higher current-carrying capacity given the same voltage $V_{GS}$ applied.

As is known, each power MOSFET is characterized by an FBSOA (Forward-Biased Safe-Operating Area) delimited by a curve that defines the maximum values of the drain-to-source voltage $V_{DS}$ and of the drain-to-source current $I_{DS}$ in which it operates properly. Moreover, each power MOSFET has a current $I_{DS}$ transfer characteristic as a function of the gate-to-source voltage $V_{GS}$, as the junction temperature $T_J$ varies in a parametric way, illustrated in FIG. 1. In detail, FIG. 1 shows qualitatively the transfer characteristics at a first junction temperature $T_{J,1}$, a second junction temperature $T_{J,2}$, and a third junction temperature $T_{J,3}$ (where $T_{J,1} < T_{J,2} < T_{J,3}$, and for example $T_{J,1} = -55°$ C., $T_{J,2} = 25°$ C., and $T_{J,3} = 150°$ C.). As may be noted, each of the transfer characteristics has an increasing trend as the voltage $V_{GS}$ increases. Moreover, the above transfer characteristics intersect each other at a ZTC point (Zero Temperature Coefficient) corresponding to a ZTC voltage $V_{GS(ZTC)}$ and a ZTC current $I_{DS(ZTC)}$. Consequently, for $V_{GS} = V_{GS}(ZTC)$, the current $I_{DS}$ of the power MOSFET remains stable and unvaried as the junction temperature $T_J$ varies. For $V_{GS} > V_{GS(ZTC)}$, the current $I_{DS}$ decreases as the junction temperature $T_J$ increases (in other words, the ratio between the variation of the saturation current density $J_{DS,sat}$ and the variation of the junction temperature $T_J$ has a negative value, i.e., $\Delta J_{DS,sat}/\Delta T_J < 0$), thus guaranteeing a condition of thermal stability of the power MOSFET (stability region). Instead, for $V_{GS} < V_{GS(ZTC)}$, the current $I_{DS}$ increases as the junction temperature $T_J$ increases (in other words, the ratio between the variation of the saturation current density $J_{DS,sat}$ and the variation of the junction temperature $T_J$ has a positive value, i.e., $\Delta J_{DS,sat}/\Delta T_J > 0$), causing a condition of thermal instability of the power MOSFET (instability region). In fact, for $V_{GS} < V_{GS(ZTC)}$ the process of breakdown of the power MOSFET by thermal drift occurs.

Known solutions to the above problem envisage designing the power MOSFET so as to reduce the values of the ZTC voltage $V_{GS(ZTC)}$ and of the ZTC current $I_{DS(ZTC)}$, thus minimizing the corresponding instability region. However, it has been demonstrated that there exists an inverse dependence between the ZTC point and the ON resistance $R_{DSon}$: the lower is the ZTC point (i.e., the lower are the ZTC voltage $V_{GS(ZTC)}$ and the ZTC current $I_{DS(ZTC)}$), the higher is the ON resistance $R_{DSon}$. Consequently, modern MOSFET technologies, which guarantee excellent performance at high power and high switching frequency, are characterized by low ON resistances $R_{DSon}$ (and therefore by good performance when they operate in the ohmic region) but tend to be intrinsically less robust to phenomena of thermal drift.

In the production of current power devices a compromise is therefore reached between the ON resistance $R_{DSon}$ and the ZTC point (which is indicative of thermal stability), which leads to optimization of the use of such devices either in the saturation region or in the linear region.

BRIEF SUMMARY

In various embodiments, the present disclosure provides a power MOSFET device that solves the problems of known devices and in particular enables better values of ON resistance and operating area to be achieved.

According to the present disclosure, a power MOSFET device, a manufacturing process thereof and an operating method thereof are provided.

BRIEF DESCRIPTION OF THE SEVERAL VIEWS OF THE DRAWINGS

For a better understanding of the present disclosure, preferred embodiments thereof are now described purely by way of non-limiting example and with reference to the attached drawings, wherein.

DETAILED DESCRIPTION

In the ensuing description, elements that are in common in the various embodiments are indicated with the same reference numbers.

Figure 1:
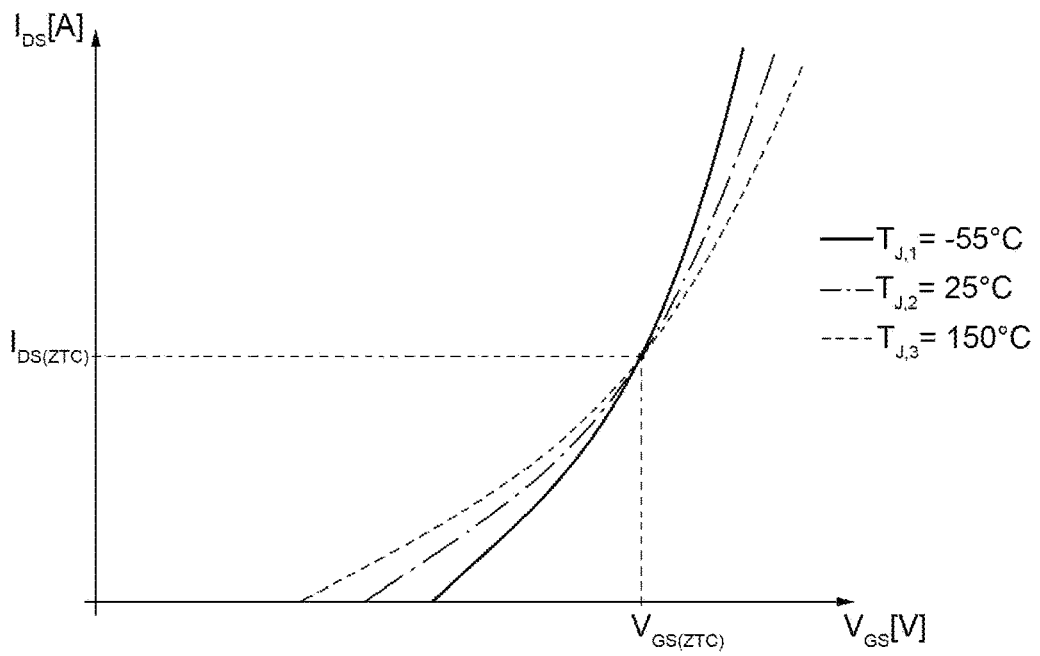
FIG. 1 shows the characteristic of the current as a function of the gate voltage in a power MOSFET, as a junction temperature varies in a parametric way.
Figure 2:
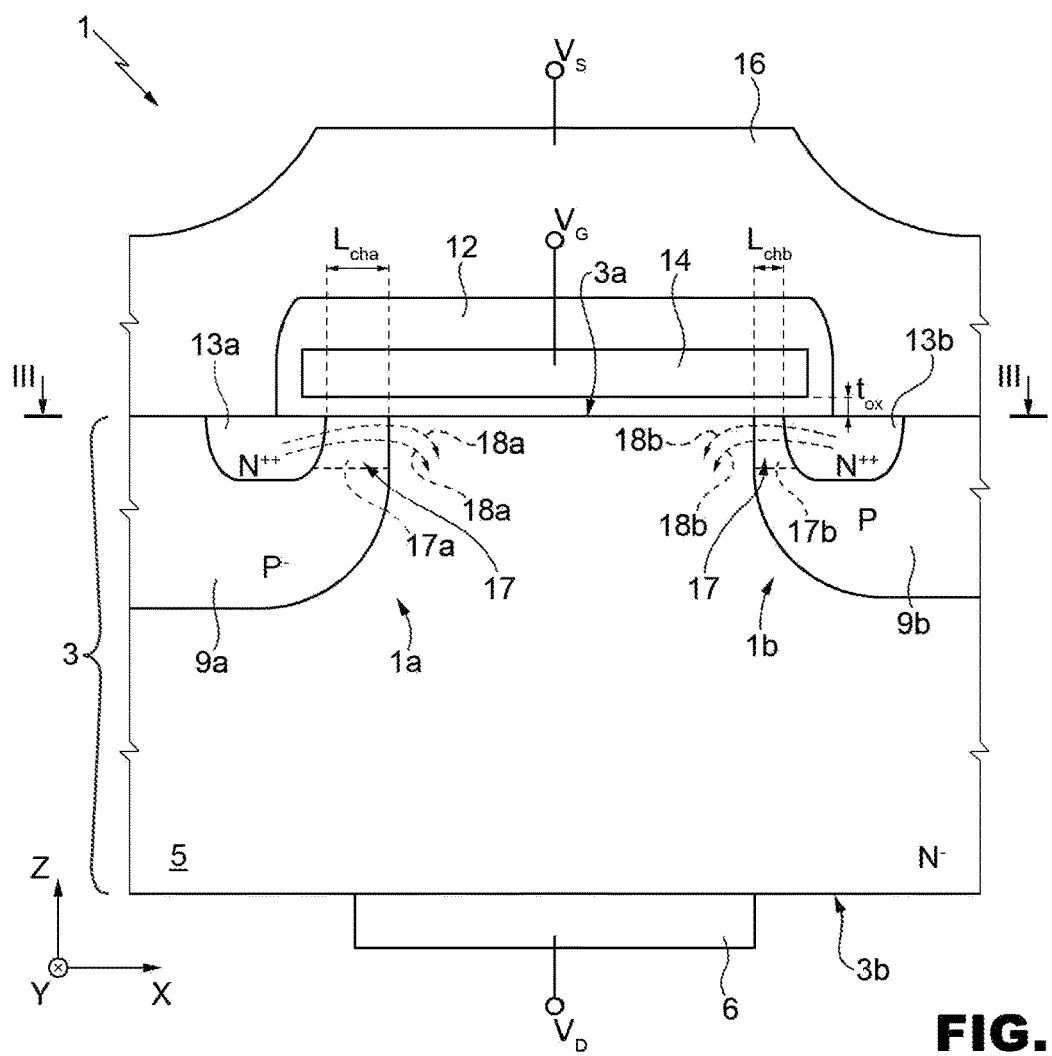
FIG. 2 is a cross-sectional view, taken along the lines of section II-II of FIG. 3, of a power device according to one embodiment.

FIG. 2 shows a power device (or power MOSFET device) 1, which in the embodiment described by way of example includes a first device portion 1a and a second device portion 1b. The power device 1 has a main extension parallel to a first axis Y of a Cartesian reference system XYZ, and FIG. 2 shows a cross-sectional view perpendicular to said main extension.

The power device 1 includes a semiconductor body 3, for example of silicon, having a front surface 3a and a rear surface 3b. The semiconductor body 3 accommodates a drain region 5, which has a first conductivity type (for example, an N type conductivity) and a first conductivity value and extends in the semiconductor body 3 starting from the rear surface 3b towards the front surface 3a. A drain metallization 6 extends on the rear surface 3b, in direct electrical contact with the drain region 5 and forms a drain electrical terminal.

A first body region 9a and a second body region 9b extend in the semiconductor body 3 starting from the front surface 3a towards the rear surface 3b and are physically separated from one another (in a direction parallel to a second axis X of the Cartesian system XYZ) and from the rear surface 3b (in a direction parallel to a third Cartesian axis Z) by the drain region 5. Both the first body region 9a and the second body region 9b have a second conductivity type (here, a P type conductivity). In particular, the first body region 9a has a second conductivity value, whereas the second body region 9b has a third conductivity value, higher than the second conductivity value.

A first source region 13a and a second source region 13b, having the first conductivity type (here, an N type conductivity) and a fourth conductivity value, higher than the first, extend within the first and second body regions 9a, 9b, respectively, starting from the front surface 3a. In a direction parallel to the second axis X, each source region 13a, 13b is physically separated (i.e., set at a distance) from the drain region 5 by a respective portion of the first and second body regions 9a, 9b, respectively, which form a first channel region 17a and a second channel region 17b, respectively (which therefore have, respectively, the second and, respectively, the third conductivity value higher than the second conductivity value). In particular, the first channel region 17a has, in a direction parallel to the second axis X, a first channel length $L_{cha}$ measured at the front surface 3a, whereas the second channel region 17b has, in a direction parallel to the second axis X, a second channel length $L_{chb}$ measured at the front surface 3a. The channel lengths $L_{cha}$, $L_{chb}$ are different from one another. In detail, in the embodiment of FIG. 2, the first channel length $L_{cha}$ is greater than the second channel length $L_{chb}$.

In particular, in a manner known to the person skilled in the art, the conductivity values of the body regions 9a and 9b are chosen, together with other design parameters, so as to set the threshold voltages $V_{th}$ at desired values and in particular, as discussed in detail hereinafter, so as to cause the first device portion 1a to turn on at a lower value of the gate voltage $V_G$ than the second device portion 1b.

In one embodiment, the power device 1 can have a first channel length $L_{cha}$ comprised between 150 nm and 1000 nm, in particular approximately 500 nm, and a second channel length $L_{chb}$ comprised between 100 nm and 900 nm, in particular approximately 350 nm. Moreover, during fabrication and as described in detail hereinafter, the first doping value for obtaining the drain region 5 is comprised between $1 \cdot 10^{14}$ ions/cm$^3$ and $5 \cdot 10^{16}$ ions/cm$^3$, for example approximately $2 \cdot 10^{16}$ ions/cm$^3$, the second doping value for implantation of the first body region 9a is comprised approximately between $1 \cdot 10^{12}$ ions/cm$^2$ and $1 \cdot 10^{13}$ ions/cm$^2$, the third doping value for implantation of the second body region 9b is comprised approximately between $5 \cdot 10^{12}$ ions/cm$^2$ and $5 \cdot 10^{13}$ ions/cm$^2$, and the fourth doping value for implantation of the source regions 13a, 13b is comprised between $5 \cdot 10^{15}$ ions/cm$^2$ and $5 \cdot 10^{16}$ ions/cm$^2$, for example approximately $1 \cdot 10^{16}$ ions/cm$^2$.

The power device 1 moreover has an oxide layer 12 on the front surface 3a. The oxide layer 12 is, for example, of silicon dioxide ($SiO_2$) and surrounds a gate region 14 of conductive material (for example, metal or doped polysilicon) so as to insulate the gate region 14 physically and electrically from the front surface 3a of the semiconductor body 3. The gate region 14 is moreover electrically connected to a gate metallization (not illustrated) in a per se known manner to the person skilled in the art.

A source metallization 16 (defining a source electrical terminal of conductive material, such as metal) extends on the oxide layer 12 and on the front surface 3a, where the latter is not covered by the oxide layer 12, and is in direct electrical contact with the source regions 13a, 13b and the body regions 9a, 9b, which are therefore electrically coupled together.

In practice, the drain metallization 6, the drain region 5, the first body region 9a, the first source region 13a, the gate region 14, the oxide layer 12, and the source metallization 16 form the first device portion 1a, whereas the drain metallization 6, the drain region 5, the second body region 9b, the second source region 13b, the gate region 14, the oxide layer 12, and the source metallization 16 form the second device portion 1b.

The first device portion 1a is therefore characterized by the first channel length $L_{cha}$ and by the second conductivity value of the first body region 9a, whereas the second device portion 1b is characterized by the second channel length $L_{chb}$ and by the third conductivity value of the second body region 9b.

Figure 3:
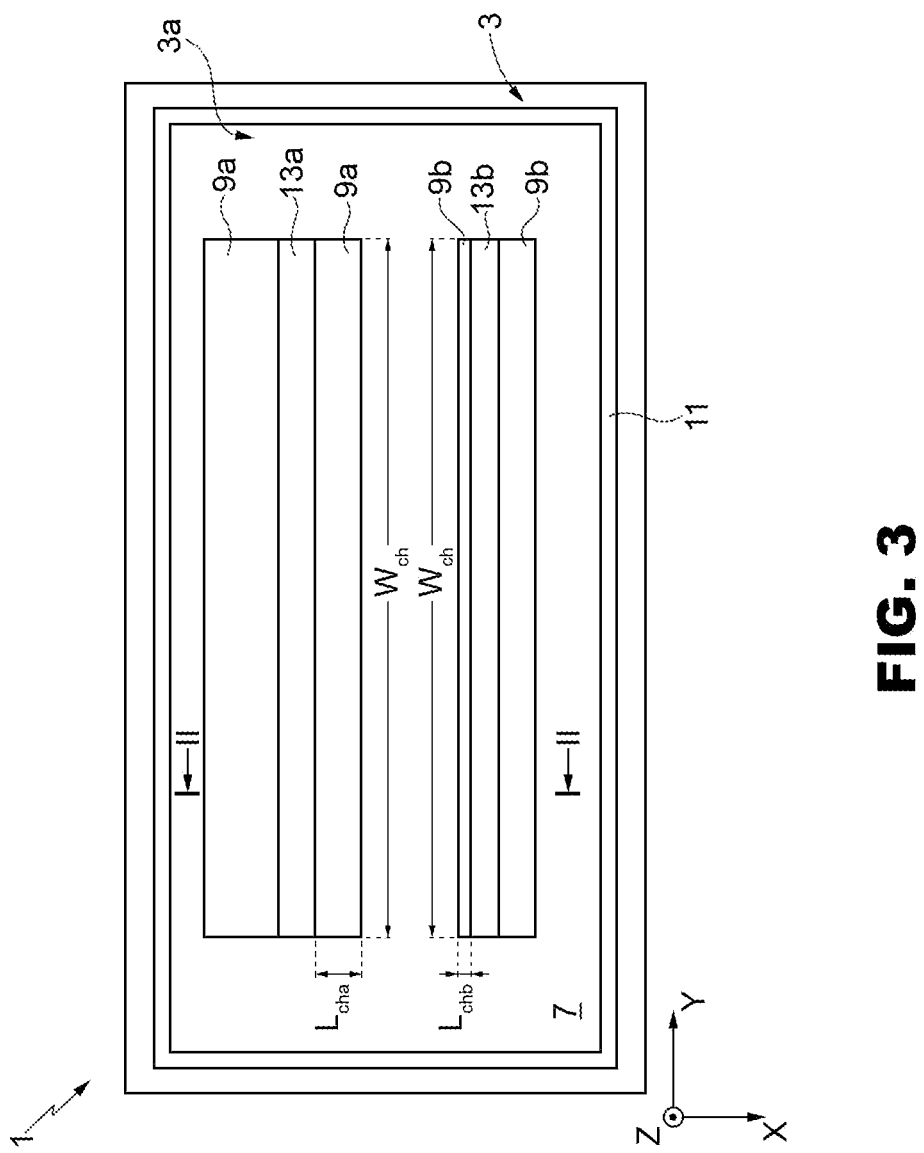
FIG. 3 is a cross-sectional view, taken along the lines of section of FIG. 2, of the power device of FIG. 2.

As may be noted from FIG. 3, the channel regions 17a, 17b of the device portions 1a, 1b have widths, in a direction parallel to the first axis Y, that are the same as one another and equal to a channel extension $W_{ch}$ (also referred to as channel width $W_{ch}$).

Moreover, as may be seen from FIG. 3, both of the device portions 1a, 1b extend within an active region 7 of the power device 1. In particular, the semiconductor body 3 includes a field insulation region 11 (of insulating material, such as $SiO_2$), having a closed shape and delimiting the active region 7 of the power device 1. The insulation region 11 has the function of electrically insulating the active region 7 (and therefore the power device 1a, 1b) from the remaining portion of semiconductor body 3. The active region 7, and the device portions 1a and 1b included therein, are therefore galvanically insulated from possible devices comprised in the semiconductor body 3 but external to the active region 7.

In a known manner, during use, the power device 1 is biased by applying a source voltage $V_S$ to the source metallization 16 (for example, a ground reference voltage GND), whereas a drain voltage $V_D$ (e.g., from 30 V to 1700 V) is applied to the drain metallization 6. Moreover, when the power device is in the conduction state, the gate region 14 is biased at a gate voltage $V_G$ such as to generate respective flows of charge carriers (here electrons) 18a, 18b through, respectively, the channel regions 17a, 17b, (as illustrated in FIG. 2).

In use, the total conduction of the power device 1 is therefore a function of both of the electron flows 18a, 18b (each corresponding to a respective device portion 1a, 1b).

As is known, in power MOSFETs the following relations apply:

$$I_{DSsat} \sim \frac{W_{ch} \cdot \mu}{t_{ox} \cdot L_{ch}}(V_G - V_{TH})^2$$

$$R_{Dson} \sim R_0 + \frac{t_{ox} \cdot L_{ch}}{W_{ch} \cdot \mu} \cdot \frac{1}{V_G - V_{TH}}$$

$$V_{TH} \sim t_{ox} \cdot \sqrt{N_A}$$

where $I_{DSsat}$ is the drain-source current (also referred to hereinafter as first current $I_a$ when referring to the first device portion 1a and second current $I_b$ when referring to the second device portion 1b), $W_{ch}$ is the channel extension, $V_{TH}$ is the threshold voltage (i.e., the minimum potential difference that can be applied between the gate region 14 and the source regions 13a, 13b of the device portions 1a, 1b to form the respective conduction channels), $R_{DSon}$ is the ON resistance, $t_{ox}$ is the thickness of the oxide layer 12 (measured parallel to the third axis Z, and for example comprised between 20 nm and 150 nm), $N_A$ is the concentration of channel dopant ions (linked to the second conductivity value for the first body region 9a, and to the third conductivity value for the second body region 9b), $\mu$ is the mobility of the charge carriers (here electrons), and $R_0$ is an offset value of the ON resistance that depends both upon the maximum voltage $V_{DS}$ sustainable by the power device 1 in the inhibition state and by the parasitic resistive contributions associated to the connection of the drain and source terminals.

In particular, since the conductivity values of the body regions 9a, 9b are different from one another, the device portions 1a, 1b have threshold voltages $V_{TH}$ different from one another (a first threshold voltage $V_{THa}$ for the first device portion 1a, and a second threshold voltage $V_{THb}$ for the second device portion 1b). In particular, in the considered embodiment, the first threshold voltage $V_{THa}$ is lower than the second threshold voltage $V_{THb}$ (for example, the first threshold voltage $V_{THa}$ is equal to 3 V, and the second threshold voltage $V_{THb}$ is equal to 6 V). Moreover, since the channel lengths $L_{cha}$, $L_{chb}$ are different from one another, the device portions 1a, 1b have ON resistances $R_{DSon}$ different from one another (a first ON resistance $R_{DSona}$ for the first device portion 1a, and a second ON resistance $R_{DSonb}$ for the second device portion 1b). In detail, the first ON resistance $R_{DSona}$ is greater than the second ON resistance $R_{DSonb}$ in a proportion that depends upon the ratio between the two different channel lengths $L_{cha}$, $L_{chb}$. By varying the conductivity values of the body regions 9a, 9b and the channel lengths $L_{cha}$, $L_{chb}$ it is therefore possible to obtain different behaviors from the device portions 1a, 1b, also taking into account the fact that the saturation current $I_{DSsat}$ depends in a quadratic way (therefore with a second-degree dependence) upon the threshold voltage $V_{TH}$, whereas the ON resistance $R_{DSon}$ depends in an inversely proportional way (therefore with a first-degree dependence) upon the threshold voltage $V_{TH}$ (linked to the conductivity values of the body regions 9a, 9b).

In use, the power device 1 switches from the OFF state to the ON state, and vice versa.

Figure 4A:
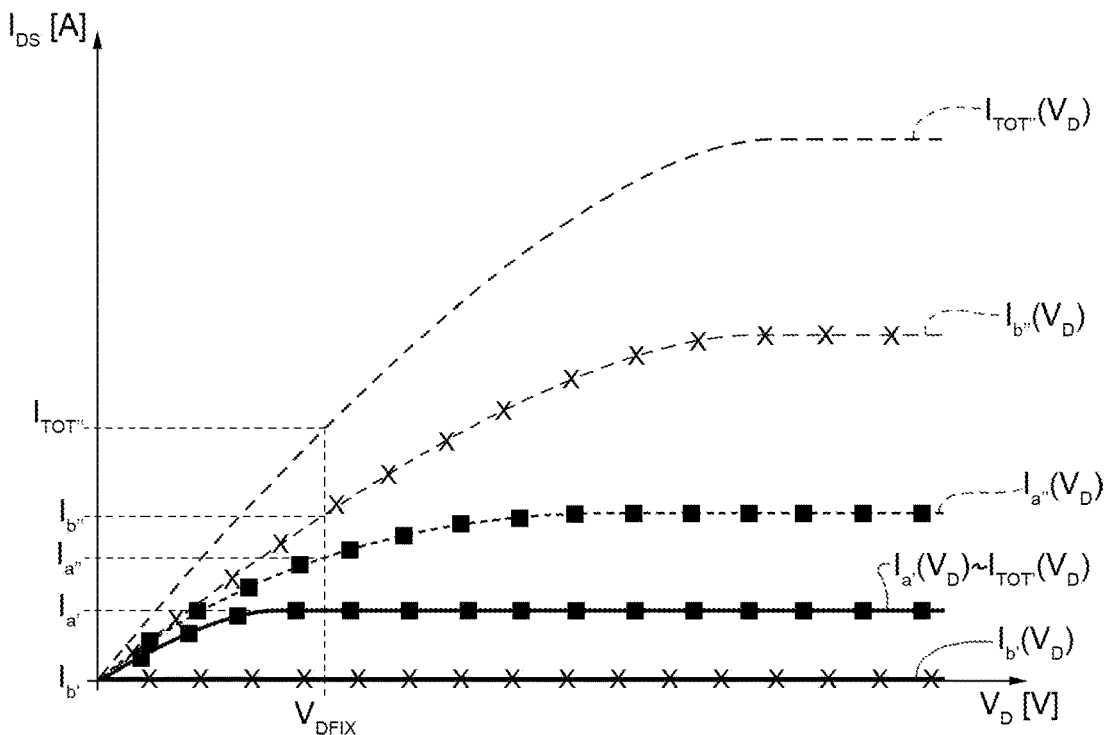
FIG. 4A shows the output characteristics of the power device of FIG. 2 in different operating modes thereof.

With reference to the transition from the OFF state to the ON state, as illustrated in FIG. 4A, the power device 1 starts switching as the gate voltage $V_G$ increases with respect to an OFF value (for example, equal to 0 V), with the drain voltage $V_D$ set at a value $V_{DFIX}$. When the gate voltage $V_G$ reaches the first threshold voltage $V_{THa}$ and is lower than the second threshold voltage $V_{THb}$ (first operating mode, where the gate voltage $V_G$ has a first value $V_{G1}$), the first device portion 1a starts to switch on (first value $I_{a'}$ of the first current $I_a$), while the second device portion 1b is still turned off (in the inhibition state; i.e., it has a first value $I_{b'}$ of the second current $I_b$ that is substantially zero) given that it has a higher value of the threshold voltage $V_{TH}$. Considering that the overall performance of the power device 1 is given by a total current $I_{TOT}$, sum of the first current $I_a$ and the second current $I_b$, the power device 1 works here only with the first device portion 1a. In other words, a first value $I_{TOT'}$ of the total current $I_{TOT}$ is substantially equal to the first value $I_{a'}$ of the first current $I_a$, given that the first value $I_{b'}$ of the second current $I_b$ is substantially zero. In the typical conditions (and in particular at the of gate voltage $V_G$ and drain voltage $V_D$ used) in which the power device 1 operates, its overall behavior substantially coincides with the saturation mode of the first device portion 1a, with a low value of total current $I_{TOT}$ and a good thermal stability.

When the gate voltage $V_G$ exceeds the second threshold voltage $V_{THb}$ (second operating mode, where the gate voltage $V_G$ has a second value $V_{G2}$), both the first device portion 1a and the second device portion 1b are active (i.e., they have a second value $I_{a''}$ of the first current $I_a$ and, respectively, a second value $I_{b''}$ of the second current $I_b$, that are both non-zero); therefore, the total current $I_{TOT}$ has a second value $I_{TOT''}$ equal to the sum of the second value $I_{a''}$ of the first current $I_a$ and of the second value $I_{b''}$ of the second current $I_b$. In particular, here, in the typical conditions (and in particular at the gate voltages $V_G$ and drain voltages $V_D$ used) in which the power device 1 operates, both the first device portion 1a and the second device portion 1b operate in the ohmic region. At high gate voltages $V_G$, the overall behavior of the power device 1 is therefore substantially the ohmic mode for both of the device portions 1a and 1b, with a low value of ON resistance $R_{DSon}$. Moreover, the second value $I_{TOT''}$ of the total current $I_{TOT}$ is higher than the first value $I_{TOT'}$ of the total current $I_{TOT}$. Furthermore, the aforesaid high values of gate voltage $V_G$ are higher than the ZTC point of the power device 1, which therefore does not present thermal drift issues.

Figure 4B:
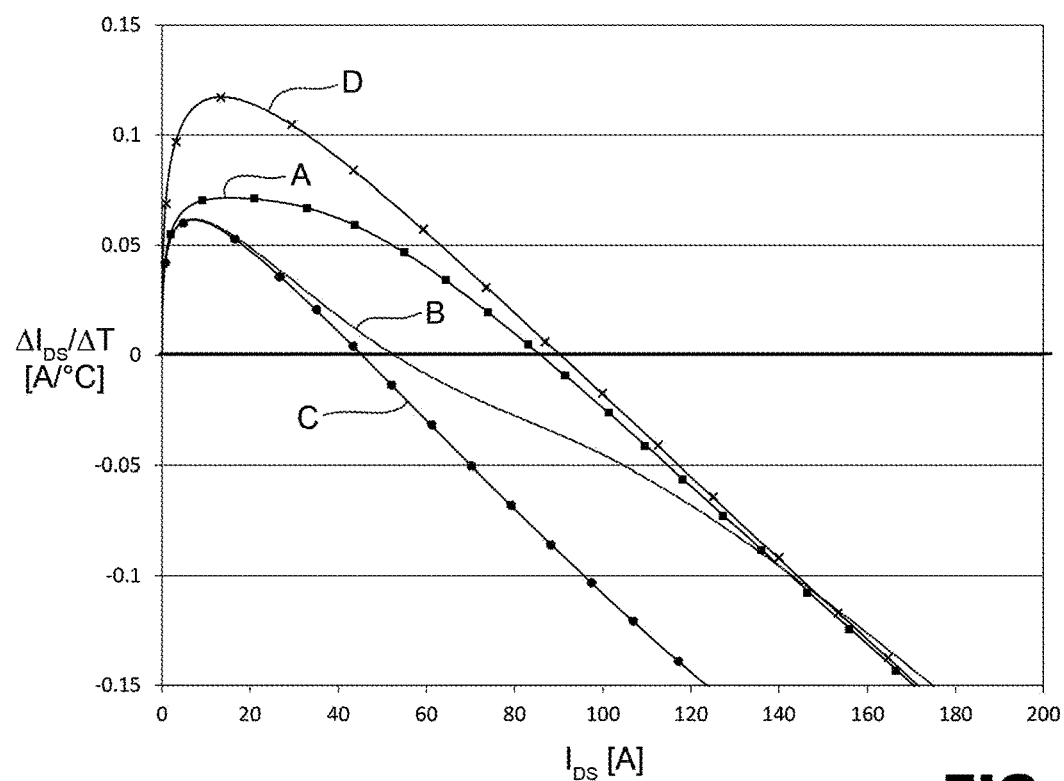
FIG. 4B shows the comparison between characteristics of thermal stability of the power device of FIG. 2 and of a power MOSFET of a known type.

FIG. 4B shows the comparison between instability areas of the power device 1 (defined by curves A, B, C, calculated as the difference between the threshold voltages $V_{THa}$, $V_{THb}$ varies in a parametric way) and an instability area of a power MOSFET of a known type (defined by a curve D), optimized for working in the ohmic region. The curve A is calculated by setting the difference between the threshold voltages $V_{THa}$, $V_{THb}$ at 1 V, the curve B is calculated by setting the difference between the threshold voltages $V_{THa}$, $V_{THb}$ at 2 V, and curve C is calculated by setting the difference between the threshold voltages $V_{THa}$, $V_{THb}$ at 3 V. Each instability area is the area subtended by positive values of the respective curve defined by a coefficient $\Delta I_{DS}/\Delta T$, as a function of the current $I_{DS}$ (saturation current $I_{DSsat}$). In particular, the instability area of the power device 1 is lower than that of the power MOSFET of a known type, and decreases as the difference between the first and second threshold voltages $V_{THa}$, $V_{THb}$ increases.

Figure 5:
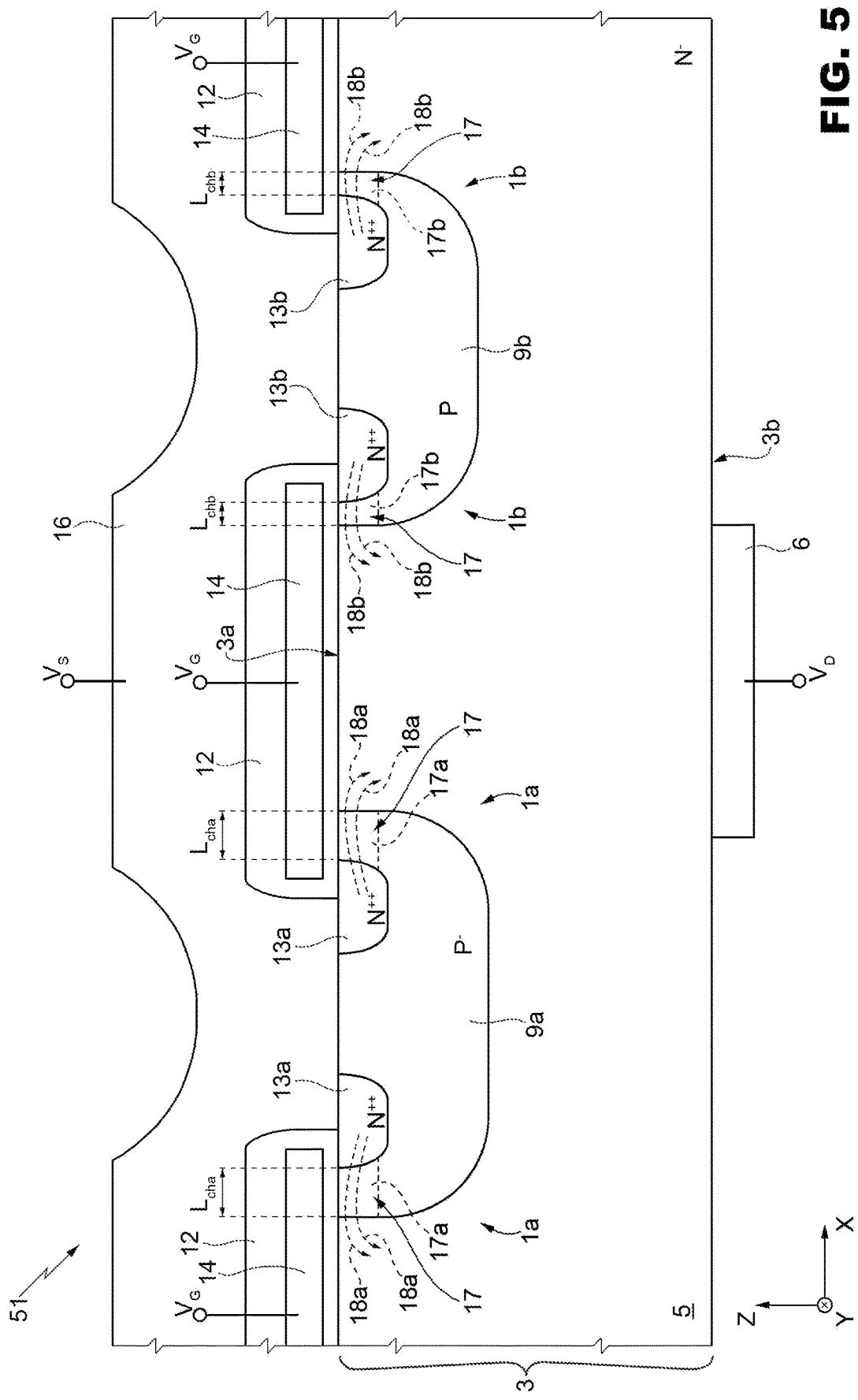
FIGS. 5-7 are sections, analogous to that of FIG. 2, of different embodiments of the power device.

FIG. 5 shows a different embodiment of the power device (indicated in FIG. 5 with the reference number 51). The power device 51 includes a plurality of first and second device regions 1a, 1b (each of which is analogous to the first device region 1a and, respectively, to the second device region 1b of FIG. 2), included in an active region (analogous to the active region 7 of FIG. 3). In particular, FIG. 5 shows two first device regions 1a and two second device regions 1b, even though the number may vary according to the needs or design considerations.

In the embodiment provided by way of example in FIG. 5, each first body region 9a accommodates two first source regions 13a, physically distanced between each other by a portion of the first body region 9a itself. Said first source regions 13a extend in the first body region 9a substantially to a same depth (measured along the first axis Y), and each first source region 13a is physically distanced from the drain region 5, along the second axis X, by a distance equal to the first channel length $L_{cha}$ (thus forming respective first channel regions 17a). Likewise, each second body region 9b accommodates two second source regions 13b, physically distanced between each other by a portion of the second body region 9b itself. Said second source regions 13b extend in the second body region 9b substantially to a same depth (measured along the first axis Y), and each second source region 13b is physically distanced from the drain region 5, along the second axis X, by a distance equal to the second channel length $L_{chb}$ (thus forming respective second channel regions 17b).

In the section of FIG. 5, the first body regions 9a and the second body regions 9b are arranged so as to alternate with one another, to form an array along the second axis X. Consequently, each first channel region 17a faces, via the drain region 5, a respective second channel region 17b (and vice versa).

The power device 51 further includes a plurality of gate regions 14. In particular, each gate region 14 extends on the two channel regions 17a, 17b that face one another, as well as on the portion of the drain region interposed between them, to form a structure analogous to the one illustrated in FIG. 2.

In use, all the gate regions 14 are set at the same gate voltage $V_G$, the source regions 13a, 13b are set at the same source voltage $V_S$ (common also to the body regions 9a, 9b), and the drain region 5 is set, at the rear surface 3b, at the drain voltage $V_D$.

Figure 6:
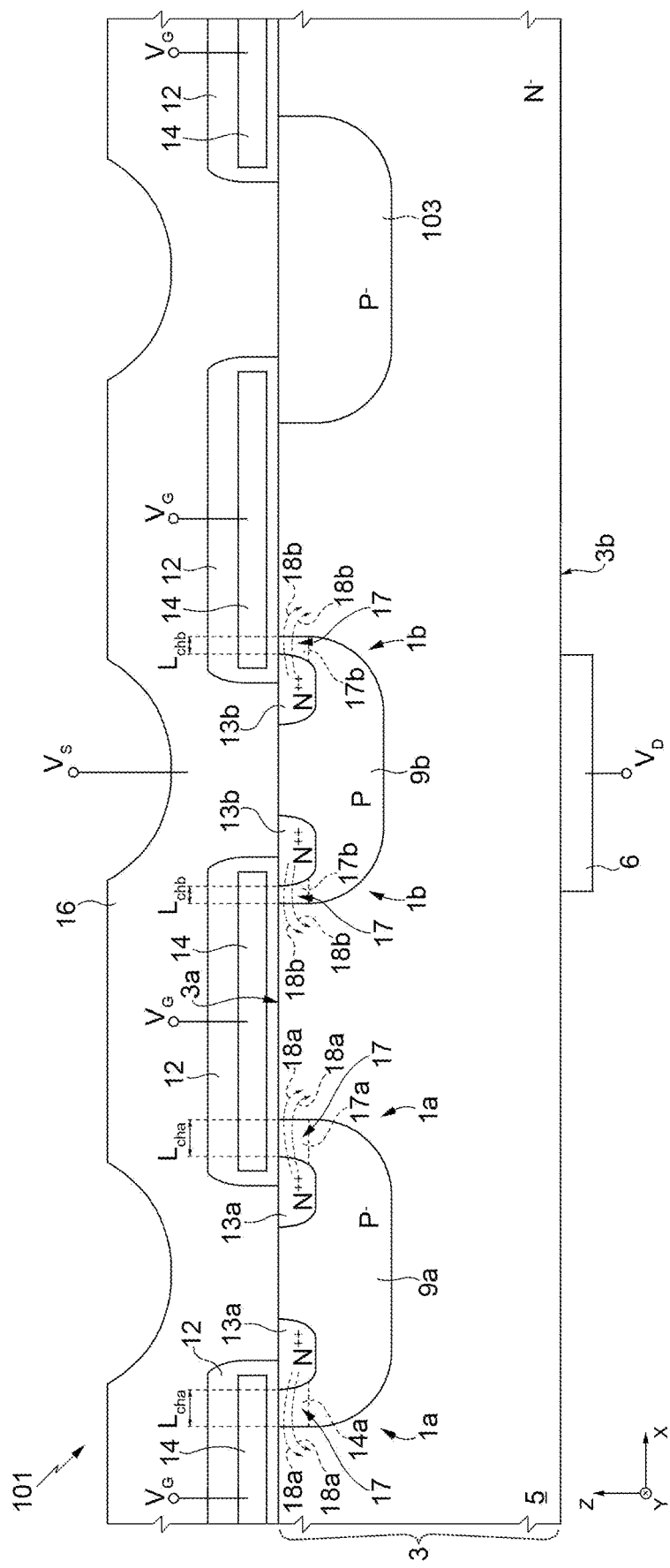

According to a different embodiment illustrated in FIG. 6, the power device, here indicated with the reference number 101, is analogous to the one represented in FIG. 5, but includes at least one doped region 103 having a conductivity type different from that of the semiconductor body 3 (and therefore here having a P type conductivity) and a value equal to the second conductivity value or, alternatively, to the third conductivity value. In particular, the at least one doped region 103 is present in the power device 101 in the place of at least one respective body region 9a, 9b, and is also included in the active region 7. For instance, FIG. 6 shows the presence of a doped region 103 in the power device 101, which replaces a respective first body region 9a (in this case, it has the second conductivity value). Considering, instead, the case wherein the power device includes a number of doped regions 103, the doped regions 103 can replace a respective number of body regions 9a, 9b in a random way or respecting a predefined relation (for example, in a periodic way in a direction parallel to the axis X).

The doped regions 103 differ structurally from the body regions 9a, 9b only as regards the absence of respective source regions 13a, 13b accommodated therein. The absence of source regions 13a, 13b leads to the impossibility, in said doped regions 103, of forming the device portions 1a, 1b (i.e., the impossibility of generating the conduction channels). Consequently, as the number of doped regions 103 increases, the number of device portions 1a, 1b present in the power device 101 decreases. The ON resistance $R_{DSon}$ of the power device 101 therefore increases, and the latter presents greater thermal stability (since the overall maximum current-carrying capacity of the power device 101 decreases), given a less efficient use of the area of the power device 101.

In practice, this is due to the fact that the power device 101 presents an effective channel extension (width) $W_{eff}$ smaller than a total channel extension (width) $W_{tot}$. The effective channel extension $W_{eff}$ is the sum of the channel extensions $W_{ch}$ of the device portions 1a, 1b comprised in the power device. According to one embodiment, the effective channel extension $W_{eff}$ is calculated according to the following expression:

$$W_{eff}=2W_{ch}\cdot n_{body}$$

where $n_{body}$ is the number of body regions 9a, 9b present in the power device 101.

The total channel extension $W_{tot}$ is, instead, calculated according to the following expression:

$$W_{tot}=2W_{ch}\cdot(n_{body}+n_{red})$$

where $n_{red}$ is a reduction value, here equal to the number of doped regions 103 present in the power device 101.

Considering the case provided by way of example, wherein, in a direction parallel to the second axis X, a doped region 103 is present every two body regions 9a, 9b, the total channel extension $W_{tot}$ and the effective channel extension $W_{eff}$ are related to one another by the expression:

$$W_{eff}=\tfrac{2}{3}W_{tot}$$

Figure 7:
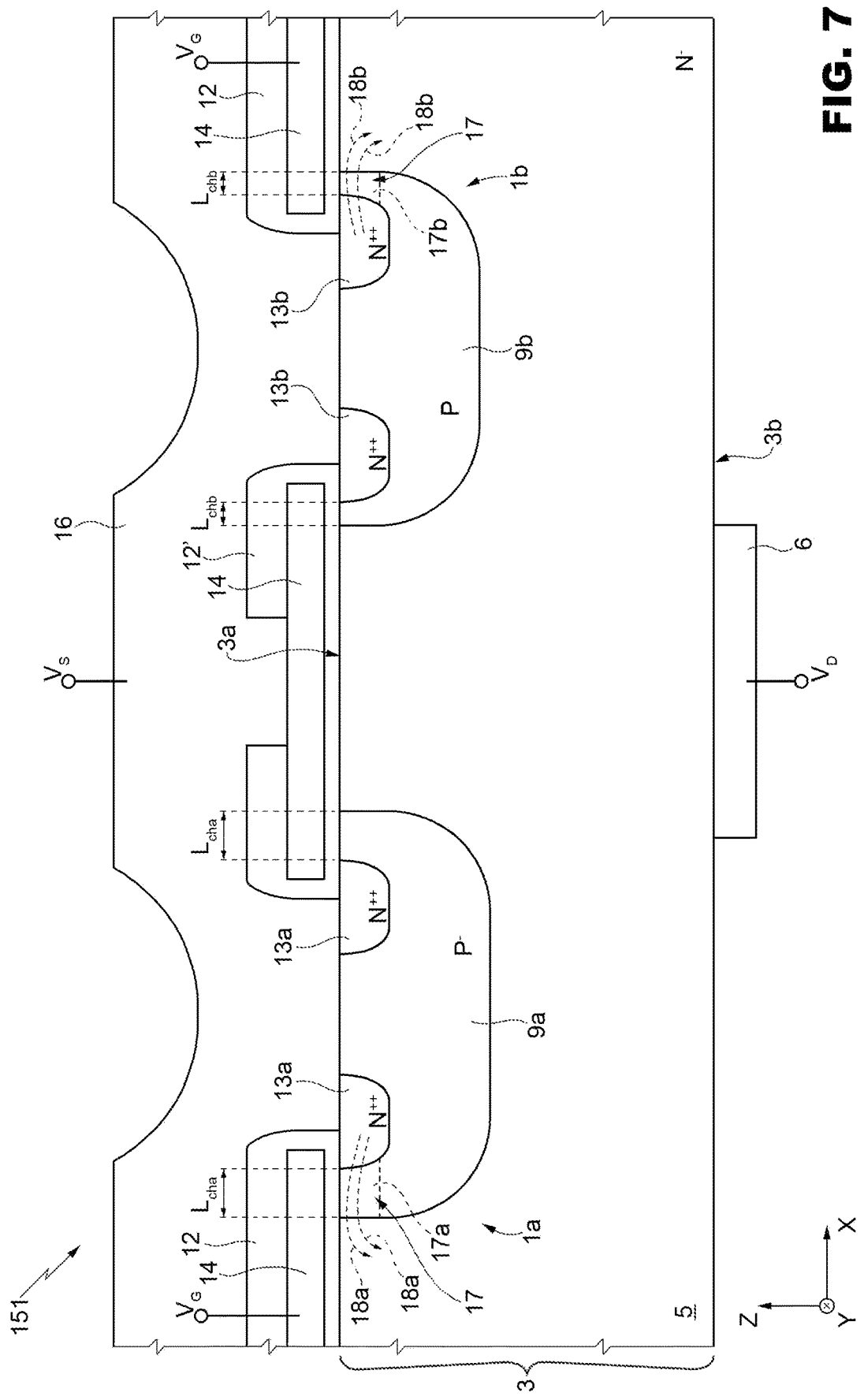

FIG. 7 shows a different embodiment of the power device, here indicated with the reference number 151, wherein the effective channel extension $W_{eff}$ is smaller than the total channel extension $W_{tot}$.

The power device 151 is analogous to the one represented in FIG. 5, except for the fact that at least one of the oxide layers 12 is, at least partially, recessed or in any case interrupted so as to form a respective interrupted-gate region 12', where the gate region 14 and the source metallization 16 are in electrical and physical contact with one another. FIG. 7 shows by way of example the case where an interrupted-gate region 12' is present. The interruption of the interrupted-gate region 12' leads to equality between the gate voltage $V_G$ of the respective gate region 14 and the source voltages $V_S$ of the source regions 13a, 13b coupled thereto (therefore, the respective gate region 14 is in electrical contact with the respective source regions 13a, 13b). Consequently, the corresponding device portions 1a, 1b cannot enter into conduction and are thus inactive.

In the case where the power device includes a number of interrupted-gate regions 12', these can be arranged in a random way or respecting a predefined relation (for example, in a periodic way in the direction of the second axis X). In particular, considering the case provided by way of example wherein, in a direction parallel to the second axis X, each oxide layer 12 alternates with an interrupted-gate region 12', the reduction value $n_{red}$ is equal to the number of interrupted-gate regions 12', and the total channel extension $W_{tot}$ and the effective channel extension $W_{eff}$ are related to one another by the expression:

$$W_{eff} = \tfrac{1}{2} W_{tot}$$

Consequently, in use, the gate regions 14 included in the interrupted-gate regions 12' are set at the same voltage as the source regions 13a, 13b (therefore, $V_G = V_S$, common also with the body regions 9a, 9b).

Figure 8A:
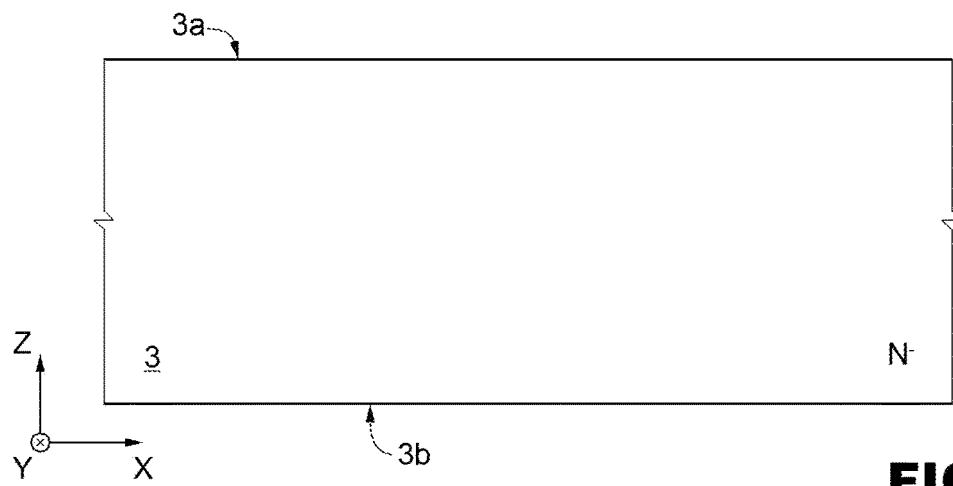
FIGS. 8A-8C show, in the same cross-sectional view as that of FIG. 2, successive steps of a manufacturing process of the power device of FIG. 2, according to one embodiment.
Figure 8B:
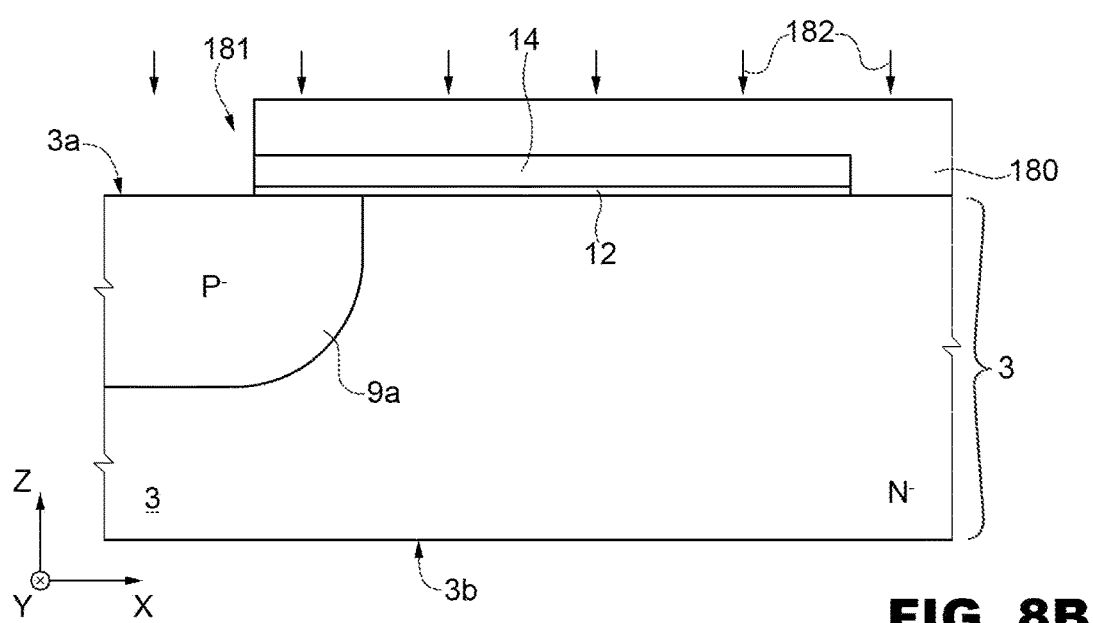
Figure 8C:
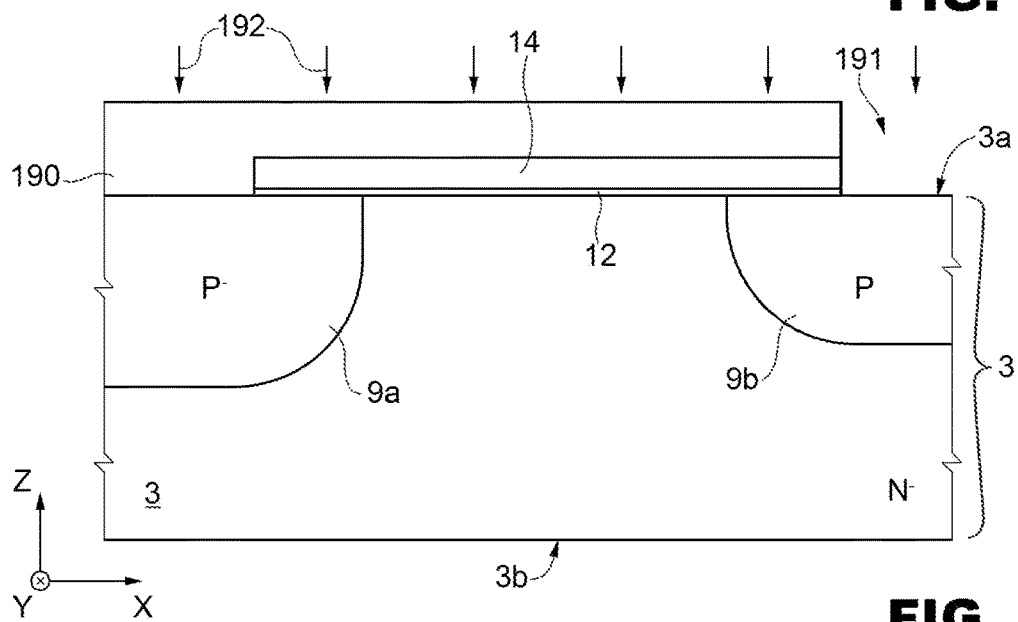

FIGS. 8A-8C show, instead, steps of a process for manufacturing the present power device. Even though the manufacturing process represented in FIGS. 8A-8C is provided by way of example, with reference to the power device 1 of FIG. 2, the fabrication of the power devices 51, 101, 151 is analogous and obvious to the person skilled in the art and therefore will not be described any further.

With reference to FIG. 8A, the manufacturing process comprises growing a plurality of epitaxial layers (not illustrated) on a substrate of semiconductor material, which has, in the context of the present description, an N conductivity. Each step of growth enables growing a respective epitaxial layer of a thickness, along the third axis Z, of some micrometers (e.g., 3-70 μm). The result of the epitaxial growth on the substrate is the formation of the drain region 5.

Then, via techniques in themselves known and starting from the front surface 3a, the insulation region 11 delimiting the active region 7 of the power device 1 is formed in the semiconductor body 3.

There then follow steps, which are in themselves known and will not be discussed any further, which lead to formation of at least part of the oxide layer 12 (in particular, of the portion of oxide layer 12 that is to be comprised between the gate region 14 and the front surface 3a) and, subsequently, to formation of the gate region 14.

With reference to FIG. 8B, there is deposited, on the front surface 3a of the semiconductor body 3 and on the gate region 14, a first photoresist layer 180 having a thickness, for example, comprised between 1 and 3 μm. Said first photoresist layer 180 coats the semiconductor body 3 entirely and in a uniform manner.

There then follows a step of photolithographic exposure of the first photoresist layer 180, via the use of a mask (not illustrated). The mask is such that a portion of the first photoresist layer 180 (at a first portion 181 of the front surface 3a of the semiconductor body 3) is exposed to lithographic exposure. The first portion 181 is arranged at the region of the semiconductor body 3 that is intended to accommodate the first body region 9a. The portions of the first photoresist layer 180 not covered by the mask thus become soluble during a subsequent etching step. Therefore, the etching step (e.g., of a wet type) is carried out to remove in a selective way the first photoresist layer 180 at the first portion 181, thus creating a first opening in the first photoresist layer 180. The photolithographic steps listed above have been described with reference to a positive photoresist. A different embodiment (not illustrated) envisages the use of a negative photoresist or of a bilayer, with appropriate modifications to the photolithographic mask used, in a manner in itself evident to the person skilled in the art. A first implantation (represented by arrows 182) of first dopants is then carried out through the first portion 181. In particular, the first dopants have a P type conductivity (for example, they are boron, indium, and aluminum ions) and a concentration equal to the second doping value mentioned above (approximately $1 \cdot 10^{12}$ to $1 \cdot 10^{13}$ ions/cm$^2$).

There then follow complete removal of the first photoresist layer 180 via etching or a lift-off process of a type in itself known, and a step of first thermal annealing that enables redistribution and activation of the first dopants; the first body region 9a is thus formed. This procedure is conducted in a protected environment (for example, in a nitrogen or argon atmosphere), at a temperature of between 900° C. and 1100° C. for a time comprised between a few tens of seconds (in the case of rapid thermal annealing, RTA) and a few hours (in the case of furnace annealing).

With reference to FIG. 8C, a second photoresist layer 190 is formed in a manner analogous to what is described with reference to FIG. 8B. In particular, the second photoresist layer 190 has a second opening that exposes a second portion 191 of the front surface 3a of the semiconductor body 3. In particular, the second opening is staggered, in top view (i.e., in a view parallel to the plane XY), with respect to the first opening. The second portion 191 is arranged at the region of the semiconductor body 3 that is intended to accommodate the second body region 9b. A second implantation (represented by arrows 192) of second dopants is then carried out in the second region 191. In particular, the second dopants have a P type conductivity and a concentration corresponding to the third doping value mentioned above (approximately $5 \cdot 10^{12}$ to $5 \cdot 10^{13}$ ions/cm$^2$).

There then follow complete removal of the second photoresist layer 190 via etching or a lift-off process of a type in itself known, and a step of first thermal annealing that enables redistribution and activation of the first dopants: the second body region 9b is thus formed. This procedure is conducted in a protected environment (for example, in a nitrogen or argon atmosphere), at a temperature of between 900° C. and 1100° C. for a time comprised between a few tens of seconds (in the case of rapid thermal annealing, RTA) and a few hours (in the case of furnace annealing).

There then follow steps that lead to formation of the power device 1 of FIG. 2, which are in themselves known and will not be discussed any further and which include formation of the source regions 13a, 13b via a further implantation of dopants (for example, arsenic, phosphorus, or antimony ions), and formation of the source metallization 16 and of the drain metallization 6. Nevertheless, it is considered obvious for the person skilled in the art that the formation of the source regions 13a, 13b may also be carried out, in a per se known manner, previously or simultaneously with formation of the body regions 9a, 9b.

With reference to FIG. 6, the doped region 103 is obtained using a mask that, during formation of the source regions 13a, 13b, covers the front surface 3a in the doped region 103.

With reference to FIG. 7, the interruption of the interrupted-gate region 12' is obtained via selective etching of the oxide layer 12, which can be obtained with a mask that exposes the region of the oxide layer 12 to be removed.

Figure 9:
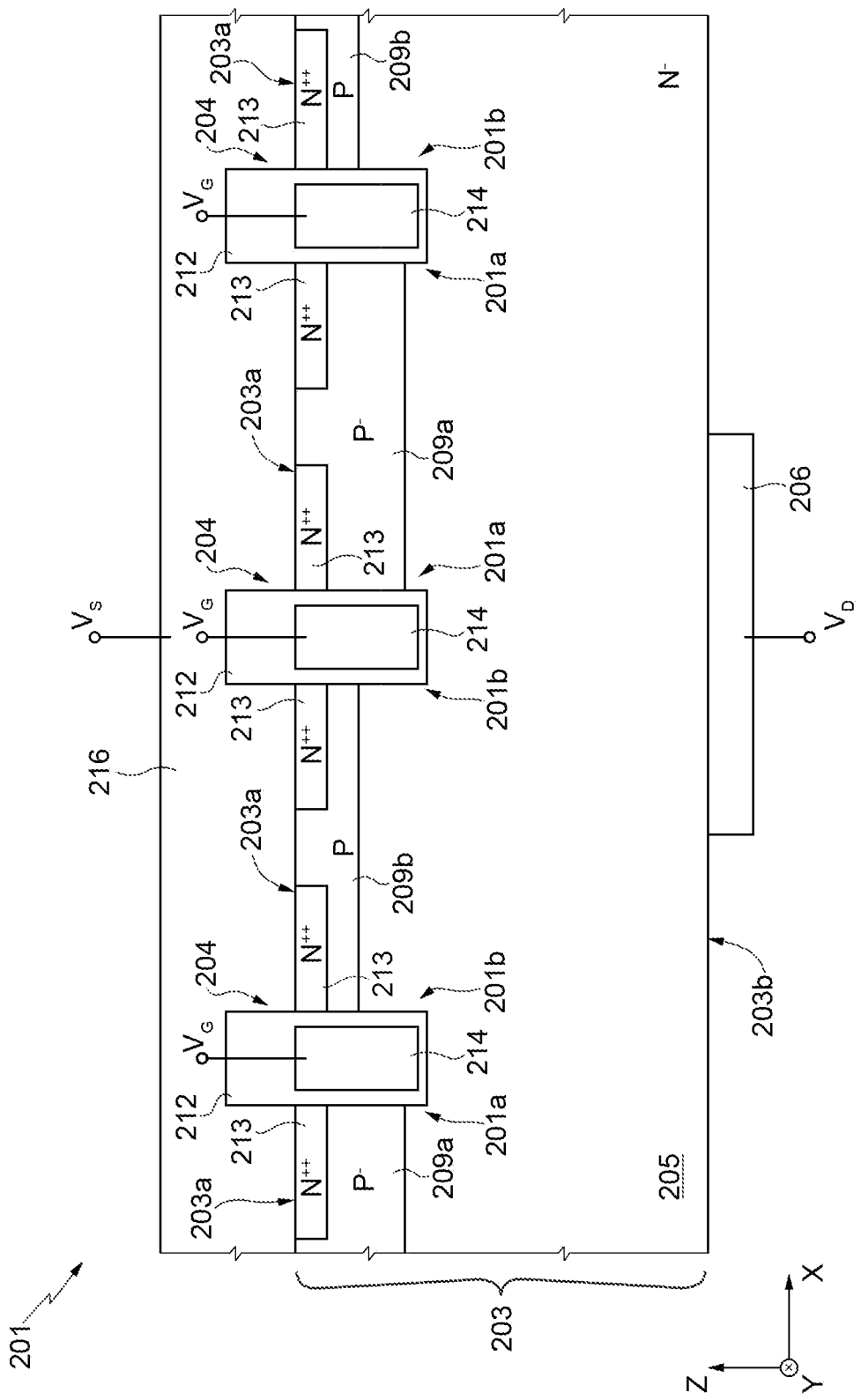
FIGS. 9-10 are sections, analogous to that of FIG. 2, of further embodiments of the power device.

FIG. 9 shows a power device 201 having trench-gate regions included in a same active region (here not illustrated) of the power device 201. In particular, the power device 201 includes at least one first device portion with trench gate (also referred to hereinafter as first trench-gate portion 201a) and at least one second device portion with trench gate (also referred to hereinafter as second trench-gate portion 201b).

The power device 201 comprises a semiconductor body 203, for example of silicon, having a front surface 203a and a rear surface 203b. The semiconductor body 203 accommodates a drain region 205, which has the first conductivity type (for example, an N type conductivity) and the first conductivity value and extends in the semiconductor body 203 starting from the rear surface 203b towards the front surface 203a. A drain metallization 206 extends on the rear surface 203b, in direct electrical contact with the drain region 205, and forms a drain electrical terminal.

Insulated-gate regions 204 extend in the semiconductor body 203 starting from the front surface 203a towards the rear surface 203b. Illustrated by way of example in FIG. 9 are three insulated-gate regions 204; however, it is evident that they may be in any number. Each insulated-gate region 204 comprises an oxide layer 212, for example of silicon dioxide, which surrounds completely a gate region 214 of conductive material (for example, metal or doped polysilicon) so as to physically and electrically insulate the gate region 214 from the remaining part of the semiconductor body 203 and from a source metallization 216. In the case represented in the sectional view of FIG. 9, each insulated-gate region 204 has a substantially rectangular shape, the major sides of which extend approximately parallel to the third axis Z, perpendicular to the front surface 203a. Moreover, the insulated-gate regions 204 may project from the front surface 203a of the semiconductor body 203.

Source regions 213, having the first conductivity type (here, an N type conductivity) and the fourth conductivity value, extend in the semiconductor body 203 starting from the front surface 203a between adjacent pairs of insulated-gate regions 204. The source metallization 216 extends over the front surface 203a and the insulated-gate regions 204 and electrically couples the source regions 213 together.

Body regions 209a, 209b, having the second conductivity type (here a P type conductivity), extend in the semiconductor body 203 underneath the source regions 213, towards the rear surface 203b. In addition, a portion of each body region 209a, 209b extends through the respective source region 213 until it physically and electrically contacts the source metallization 216, at the front surface 203a of the semiconductor body 203. The first body regions 209a have the second conductivity value and an extension, along the third axis Z, equal to the first channel length $L_{cha}$. The second body regions 209b have the third conductivity value and an extension, along the third axis Z, equal to the second channel length $L_{chb}$. In FIG. 9, the first body regions 209a alternate, along the second axis X, with the second body regions 209b.

In this manner, two stacks extend alongside each insulated-gate region 204, wherein a first stack includes a source region 213, a first body region 209a, and part of the drain region 205, and a second stack includes a source region 213, a second body region 209b, and part of the drain region 205.

Each stack having the first body region 209a forms, with the two adjacent insulated-gate regions 204 and with the drain metallization 206 and the source metallization 216, two first device portions 201a, whereas each stack having the second body region 209b forms, with the two adjacent insulated-gate regions 204 and with the drain and source metallizations 206, 216, two second device portions 201b.

The semiconductor body 203 further includes an insulation region (not illustrated) delimiting the active area of the power device 201, as illustrated in FIG. 3.

In use, the portions of the body regions 209a, 209b contiguous to the insulated-gate regions 204 form conduction channels in a per se known manner.

Figure 10:
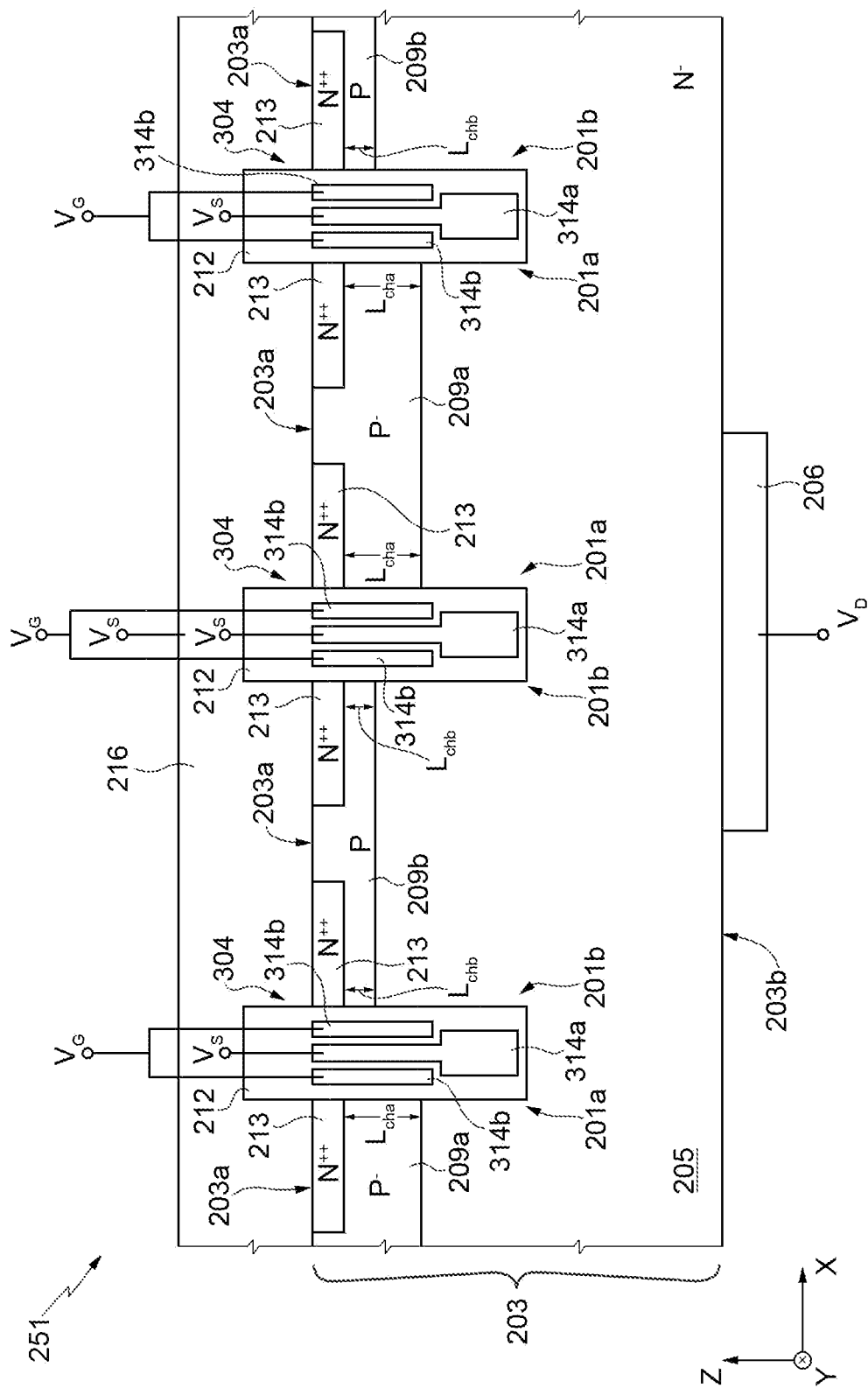

FIG. 10 shows a different embodiment of the power device (here indicated with the reference number 251), which is analogous to the power device 201 and differs from the latter in that of being of a known trench-split-gate type.

In detail, here, each insulated-gate region, indicated with 304, comprises an electrical-shielding region 314a, hereinafter referred to as field-plate region 314a, for example, of conductive material such as metal or doped polysilicon, and two split-gate regions 314b, for example, of metal or doped polysilicon. The field-plate region 314a has a shape elongated in the direction of the third axis Z, facing underneath the drain region 205. In the embodiment provided by way of example, in its top portion, approximately at the level of the source regions 213 and of the body regions 209a, 209b, the field-plate region 314a is interposed between the two split-gate regions 314b, which are electrically insulated both from the field-plate region 314a and from the adjacent stacks via the oxide layer 212.

In use, each field-plate region 314a is biased at the source voltage $V_S$, and each split-gate region 314b is biased at the gate voltage $V_G$.

According to an embodiment (not illustrated), in the power device 251 at least one insulated-gate region 304 has the split-gate regions 314b electrically disconnected from the split-gate regions 314b of the other insulated-gate regions 304 in order to reduce the effective channel extension $W_{eff}$ with respect to the total channel extension $W_{tot}$. In this embodiment, the reduction value $n_{red}$ is equal to the number of pairs of split-gate regions 214b electrically disconnected from the split-gate regions 314b of the other insulated-gate regions 304.

The manufacturing processes of the power devices illustrated in FIGS. 9 and 10 are analogous to what has been described with reference to FIGS. 8A-8C.

Furthermore, the modifications discussed with reference to the embodiments in FIGS. 6 and 7 apply (even in combination with one another), in a manner that is obvious to the person skilled in the art, also to the embodiments of the power devices of FIGS. 9 and 10.

According to one embodiment, the first and second device portions, in all the solutions illustrated, are arranged as elements alternating with one another of a two-dimensional matrix. In particular, the device portions can alternate with one another in both directions of the matrix (for example, both horizontally and vertically) so as to present a checkerboard arrangement, wherein each first device portion (for example, having a position (i, j) in said matrix) has as first neighbors in the directions of the matrix (i.e., the cells of the matrix having the positions (i−1, j), (i, j−1), (i+1, j), and (i, j+1)) second device portions, and vice versa.

According to a further embodiment (not illustrated) of the present disclosure, the number $N_1$ of the first device portions is different from the number $N_2$ of the second device portions. Alternatively, or in addition, the channel extensions $L_{ch}$ of the conduction channels of the device portions may be different from one another, and therefore it is possible to have a first effective channel extension $W_{eff,a}$ (referring to the first device portion) and a second effective channel extension $W_{eff,b}$ (referring to the second device portion) that are different from one another. In particular, according to one embodiment, the smaller between the first effective channel extension $W_{eff,a}$ and the second effective channel extension $W_{eff,b}$ is greater than a predefined value (for example, equal to 20% of the effective channel extension Way, and therefore it applies the relation $\min(W_{eff,a}, W_{eff,b}) = 0.2 \cdot W_{eff}$).

From an examination of the characteristics of the power MOSFET device, of the manufacturing process thereof and of the operating method thereof obtained according to the present disclosure, the advantages that it affords are evident.

The present disclosure makes it possible to avoid and overcome the compromise between ON resistance $R_{DSon}$ and thermal stability, which is common in currently known power devices. In fact, the coexistence in a same power device of at least two device portions, wherein a first portion is optimized for working in the saturation region, and a second portion is optimized for working in the ohmic region, allows to have a single power device with improved operation in both the operating regions, given that, here, the saturation current $I_{DSsat}$ and the ON resistance $R_{DSon}$ are decoupled from one another.

In particular, in the embodiments discussed previously, the first device portion 1a, 201a has a saturation current $I_{DSsat}$ lower than that of the second device portion 1b, 201b, and makes it possible to operate the power device at low gate voltages $V_G$ (for example, at gate voltages $V_G$ lower than a threshold gate voltage $V_{Gth}$) with a better thermal stability (i.e., minimizing the instability region and the ZTC point). At high gate voltages $V_G$ (for example, at gate voltages $V_G$ higher than the threshold gate voltage $V_{Gth}$, and in particular at values of gate voltage $V_G$ higher than the ZTC voltage $V_{GS(ZTC)}$), the second device portion 1b guarantees optimal operation of the power device in the linear region thanks to the low ON resistance $R_{DSon}$.

It is therefore possible to improve the stability (or ruggedness) of the power device, maintaining a good ON resistance $R_{DSon}$.

The present disclosure therefore guarantees, thanks to the low ON resistance $R_{DSon}$, a reduction in power consumption of the power device and in the area of substrate required.

Moreover, by reducing the effective channel extension Way with respect to the total channel extension $W_{tot}$, the stability of the power device further improves since the saturation current $I_{DSsat}$ decreases given the same occupation of area.

Finally, it is clear that modifications and variations may be made to the power MOSFET device, to the manufacturing process thereof and to the operating method thereof described and illustrated herein, without thereby departing from the scope of the present disclosure.

In particular, what has been described previously applies, in a manner obvious to the person skilled in the art, to power devices based upon technology different from silicon technology, such as silicon-carbide (SiC) power devices.

In addition, what has been previously described applies, in a manner obvious to the person skilled in the art, also to P-channel device portions 1a, 1b, 201a, 201b.

Furthermore, what has been previously described applies, in a per se obvious manner to the person skilled in the art, also to horizontal-channel signal MOSFET devices (i.e., ones in which the source region and the drain region face a same side of the semiconductor body).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A power MOSFET device, comprising:
   a semiconductor body having a first surface extending along a first direction and a second surface opposite the first surface, the semiconductor body including an active area, the active area including:
   a first body region having a first conductivity type and a first conductivity value;
   a second body region having the first conductivity type and a second conductivity value higher than the first conductivity value;
   a first source region extending in the semiconductor body from the first surface, the first source region disposed adjacent to the first body region, and having a second conductivity type different from the first conductivity type;
   a second source region extending in the semiconductor body from the first surface, the second source region disposed adjacent to the second body region, and having the second conductivity type;
   an insulated-gate region extending within or over the active area and having a first portion facing the first body region and the second body region and a second portion facing the first source region and the second source region;
   a drain region having the second conductivity type and extending in the semiconductor body from the second surface;
   a first channel region within the first body region, between the first source region and the drain region; and
   a second channel region within the second body region, between the second source region and the drain region,
   wherein the first channel region has a first channel length along the first direction, and the second channel region has a second channel length along the first direction that is smaller than the first channel length, and
   wherein the first body region, the first source region, the drain region, the first portion of the insulated-gate region, and the first channel region form a first device portion having a first threshold voltage, and the second body region, the second source region, the drain region, the second portion of the insulated-gate region, and the second channel region form a second device portion having a second threshold voltage higher than the first threshold voltage.

2. The power MOSFET device according to claim 1, further comprising an insulation region extending in the semiconductor body from the first surface and having a closed shape laterally surrounding the active area.

3. The power MOSFET device according to claim 1,
wherein the first body region and the second body region extend in the active area from the first surface towards the second surface, and are separated from one another by the drain region,
wherein the first source region and the second source region extend within the first body region and the second body region, respectively,
wherein the drain region extends up to the first surface, the drain region including a surface portion at the first surface,
wherein the insulated-gate region extends over the semiconductor body and is vertically overlapping the surface portion of the drain region and, partially, overlapping the first and second source regions and the first and second body regions, and
wherein the first channel region and the second channel region face the first surface, the first source region spaced apart from the surface portion of the drain region by a first distance, equal to the first channel length, and the second source region spaced apart from the surface portion of the drain region by a second distance, equal to the second channel length.

4. The power MOSFET device according to claim 1, wherein the first device portion and the second device portion are of a vertical-conduction type,
wherein the insulated-gate region is a trench region and extends in the semiconductor body from the first surface towards the second surface,
wherein the first body region extends, at least partially, between the drain region and the first source region and the second body region extends, at least partially, between the drain region and the second source region, and
wherein the first body region has a depth, between the drain region and the first source region, substantially equal to the first channel length in a direction transverse to the first and to the second surfaces, and the second body region has a depth, between the drain region and the second source region, substantially equal to the second channel length in the direction transverse to the first and to the second surfaces.

5. The power MOSFET device according to claim 4, wherein the insulated-gate region is a split-gate region.

6. The power MOSFET device according to claim 1, comprising a plurality of first device portions and a plurality of second device portions arranged, alternating with one another, in the form of an array or matrix.

7. The power MOSFET device according to claim 6, wherein an effective channel width of the power MOSFET device is smaller than a total channel width of the power MOSFET device,
the effective channel width being calculated according to the expression:

$$W_{eff} = 2W_{ch} \cdot n_{body}$$

where $W_{eff}$ is the effective channel width, $W_{ch}$ is a channel width of the first channel region or of the second channel region, and $n_{body}$ is a number of the first and the second body regions present in the active area; and
the total channel width being calculated according to the expression:

$$W_{tot} = 2W_{ch} \cdot (n_{body} + n_{red})$$

where $W_{tot}$ is the total channel width and $n_{red}$ is a reduction value.

8. The power MOSFET device according to claim 7, further comprising a plurality of inactive body regions in which the source regions are absent, the reduction value being equal to the plurality of inactive body regions.

9. The power MOSFET device according to claim 7, further comprising a number of inactive insulated-gate regions in electrical contact with the first and the second source regions, the reduction value being equal to the number of inactive insulated-gate regions.

10. The power MOSFET device according to claim 9, wherein the inactive insulated-gate regions are at least partially surrounded by respective interrupted oxide layers, and the inactive insulated-gate regions are in direct electrical contact with a source metallization region extending on the first surface and in direct electrical contact with the first and second source regions.

11. A power MOSFET device, comprising:
a body having a first surface extending along a first direction and a second surface opposite the first surface, the body including:
a first body region having a first conductivity type and a first conductivity value;
a second body region having the first conductivity type and a second conductivity value;
a first source region in the first body region and having a second conductivity type;
a second source region in the second body region and having the second conductivity type;
an insulated-gate region that includes a first portion that overlaps the first body region and the second body region and a second portion facing the first source region and the second source region;
a first channel region in the first body region, the first channel region having a first dimension along a first direction; and
a second channel region in the second body region, the second channel region having a second dimension along the first direction that is less than the first dimension.

12. The power MOSFET device of claim 11 wherein the second conductivity value is higher than the first conductivity value.

13. The power MOSFET device of claim 11, comprising a drain that is between the first body region and the second body region, the insulated-gate region overlapping the drain.

14. A device, comprising:
a substrate of a first conductivity type;
a first doped region spaced from a second doped region in the substrate, the first and second doped regions having a second conductivity type that is different from the first conductivity type;
a third doped region in the first doped region, the third doped region having the first conductivity type;
a fourth doped region in the second doped region, the fourth doped region having the first conductivity type; and
a gate that overlaps a portion of the first doped region, a portion of the second doped region, a portion of the third doped region, and a portion of the fourth doped region, a first dimension of the portion of the first doped region being greater than a second dimension of the portion of the second doped region.

15. The device of claim 14, wherein the first conductivity type of the substrate is a different concentration than the first conductivity type of the third doped region.

16. The device of claim 14, wherein the second conductivity type of the first doped region is a different concentration than the second conductivity type of the second doped region.

17. The device of claim 14, comprising an insulating structure around the gate.

18. The device of claim 14 wherein a first body region extends away from the gate a third dimension and a second body region extends away from the gate a fourth dimension that is less than the third dimension.

* * * * *